United States Patent [19]

Brody

[11] 4,247,914
[45] Jan. 27, 1981

[54] OPTICAL MEMORY WITH FIBER OPTIC LIGHT GUIDE

[75] Inventor: Philip S. Brody, Brookmont, Md.

[73] Assignee: The United States of America as represented by the Secretary of the Army, Washington, D.C.

[21] Appl. No.: 47,675

[22] Filed: Jun. 12, 1979

[51] Int. Cl.³ .............................................. G11C 11/42
[52] U.S. Cl. .................... 365/109; 365/117; 365/234
[58] Field of Search .............. 365/106, 109, 117, 119, 365/112, 114, 215, 234; 350/96.15

[56] References Cited

U.S. PATENT DOCUMENTS

| 3,150,356 | 9/1964 | Newman | 365/112 |
| 3,693,171 | 9/1972 | Asam | 365/109 |
| 4,021,097 | 5/1977 | McMahon | 350/96.15 |
| 4,101,975 | 7/1978 | Brody | 365/117 |

OTHER PUBLICATIONS

Wielar, Plastic Optical Fibers, Proceedings of the Society of Photo-Optical Instrumentation Engineers, Seminar on Fibre Optics Come of Age, vol. 31, pp. 3-12, San Mateo, Calif. USA (16-17 Oct. 1972).

Primary Examiner—Stuart N. Hecker
Attorney, Agent, or Firm—Nathan Edelberg; Robert P. Gibson; Saul Elbaum

[57] ABSTRACT

A three dimensional memory having an increased storage capacity. The memory block has a matrix of cylindrical cavities, each of which has a fiber optic light guide means disposed therein. Each light guide means is comprised of a cylindrical core having a first index of refraction and a cladding surrounding the core having a second, smaller index of refraction; a plurality of spaced deformations are formed at the core-cladding interface for allowing light to leak out of the guide laterally.

9 Claims, 8 Drawing Figures

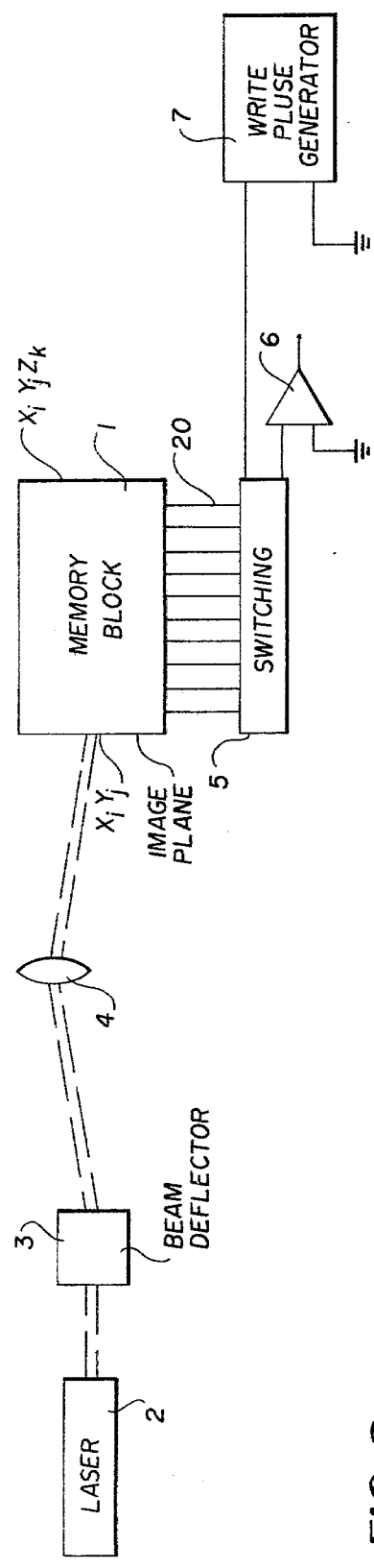
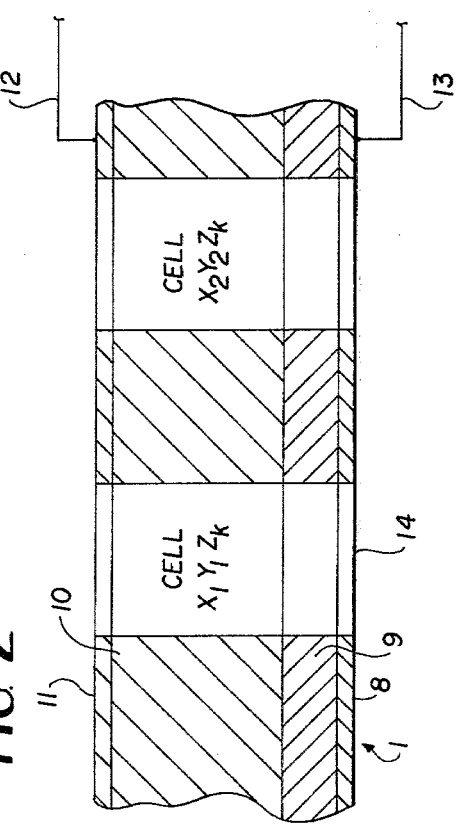
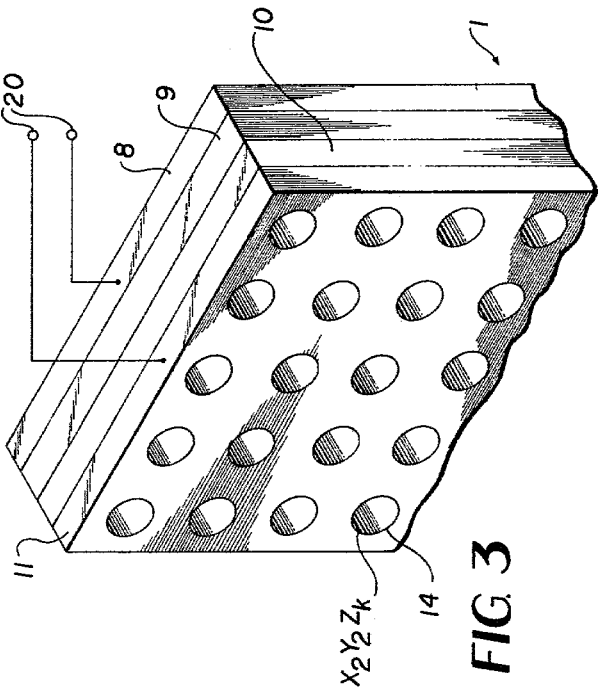
FIG. 1
FIG. 2
FIG. 3

OPTICAL MEMORY WITH FIBER OPTIC LIGHT GUIDE

RIGHTS OF THE GOVERNMENT

The invention described herein may be manufactured, used, and licensed by or for the United States Government for governmental purposes without the payment to me of any royalty thereon.

The present invention is directed to an improvement of the invention disclosed in U.S. patent application Ser. No. 824,895, filed Aug. 15, 1977, now U.S. Pat. No. 4,101,975, which is incorporated herein by reference.

The above-mentioned patent discloses a three-dimensional memory which is optically accessed in the X,Y direction by deflecting a light beam to a selected cylindrical cavity in the memory block. The memory is built up of a plurality of juxtaposed memory planes which together form the three-dimensional memory block, each plane being identified by a plane position Z, and each cylindrical cavity by a matrix position X,Y. To access a selected bit in a selected memory plane, an electrical pulse is applied to the plane for writing, and is detected from the plane for reading, while the light beam is deflected to the cavity at the desired X,Y position.

The light beam distributes itself over the interior of the cavity by a series of multiple reflections along the length of the cavity. Illumination is not uniform over the cavity wall, but rather its magnitude decreases exponentially as the distance from the cavity entrance increases. The characteristic attenuation depends on the absorption characteristic of the wall and the ratio of the cavity diameter and the distance down the cavity.

As is known, the electronics industry is constantly seeking to develop memories having larger storage capacities. The three-dimensional concept advanced in U.S. Pat. No. 4,101,975 is an attempt to provide such a memory since in comparison to a planar memory, the number of storage locations is increased by a factor equal to the number of planes which make up the three-dimensional block.

As can be appreciated, the attenuation phenomenon discussed above effectively limits the number of planes which can be written into or read since after the light has traversed a certain number of planes its intensity is too weak to perform the accessing function. This therefore limits the storage capacity of the memory, and may seriously curtail its usefulness for any given job. In accordance with the present invention a structure is provided which greatly reduces the above-mentioned attenuation and therefore permits more storage planes to be operatively used, thus increasing the storage capacity of the memory.

It is therefore an object of the invention to increase the storage capacity of a light-accessed three-dimensional memory which has a plurality of cylindrical cavities for light accessing.

It is a further object of the invention to provide a three-dimensional memory having a large storage capacity.

It is still a further object of the invention to obtain such a large storage capacity without adversely affecting other memory characteristics.

The above objects are accomplished by disposing a fiber optic light guide means in each cavity to conduct and distribute the illumination entering the cavities more uniformly along the cavity walls. Each light guide has means disposed at spaced intervals for allowing illumination to leak out of the guide laterally, thus illuminating the walls. In the illustrative embodiment of the invention, each light guide means has a cylindrical core having a first index of refraction and a cladding surrounding the core having a second, smaller index of refraction, while the means for allowing leakage are spaced deformations which are formed at the core-cladding interface.

The invention will be better understood by referring to the accompanying drawings in which:

FIGS. 1 to 4 illustrate the memory disclosed in U.S. Pat. No. 4,101,975.

FIG. 5 is a pictorial illustration which depicts light propagating down the interior of a cylindrical cavity of the memory disclosed in U.S. Pat. No. 4,101,975.

Figure 4:
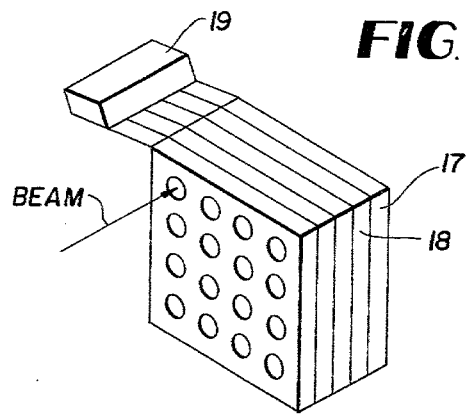

FIG. 1 is a block diagram of the general organization of the three-dimensional memory disclosed in U.S. Pat. No. 4,101,975. It is comprised of memory block 1 which is a stacked array of memory planes each of which is connected to electrical switching network 5 by conductors 20. Beam deflector 3 and lens 4 are disposed with respect to laser 2 so as to deflect the laser beam to any X,Y memory position.

In order to write information into the memory, the beam is deflected to a selected cell at a position $X_i, Y_j$, on the image plane while electrical switching network 5 simultaneously connects the electrodes of a selected memory plane $Z_k$ to write pulse generator 7. Accordingly, the information is recorded into the selected cell $X_i, Y_j, Z_k$.

To read, the beam is deflected to a selected one of the $N^2$ cells on the image plane while electrical switching network 5 simultaneously connects the conductors from a selected memory plane Z to read amplifier 6.

While the improvement of the present invention is utilized with a three-dimensional memory such as memory 1 in FIG. 1, to better understand the operation of the memory disclosed in U.S. Pat. No. 4,101,975, reference is first made to the structure and operation of a single memory plane. FIG. 2 is a cross-sectional view of a segment of a single memory plane while FIG. 3 is a perspective view of the memory plane. Each plane is comprised of photovoltaic-ferroelectric layer 9 and photoconductive layer 10, which are sandwiched between electrodes 8 and 11. Conductors 20 are attached to the electrodes for connection to electrical switching network 5. As described in the above-mentioned patent, the photovoltaic-ferroelectric material may be any of a number of ferroelectric ceramic materials.

Each of the memory planes is perforated by $N^2$ individual cylindrical hollow cavities. Each of these cavities comprises a memory cell and each is disposed at a different X,Y location on the plane.

Referring to FIG. 1, to write into a selected memory cell, the laser beam is focused into the cylindrical cavity which defines the selected cell while a voltage pulse is applied across the electrodes of the memory plane. The illumination makes the photoconductive region of the cavity wall conductive relative to its dark conductivity thereby allowing sufficient current to flow through the illuminated wall region to cause the photovoltaic-ferroelectric portion of the cavity wall to become remanently polarized. To read the information out, the cavity is illuminated while the output of the read amplifier is connected across the electrodes. Incident illumination on the photovoltaic-ferroelectric material causes a current to be induced which is proportional to the magnitude of the remanent polarization, and this current charges the total capacity across the amplifier input. The structure and theory of operation of the ferroelectric and photoconductive layers is more exhaustively discussed in U.S. Pat. No. 4,101,975.

FIG. 4 is an illustration of a three-dimensional memory. This memory is effected by stacking a plurality of memory planes as illustrated in FIG. 3 with the cylindrical cavities in register, and adding a multiple switching circuit which allows a selected sequential pair of electrodes to be selectively connected to the write pulse generator for the write operation and to the read amplifier for the read operation. Information is written into a selected one of the memory cells by illuminating the selected cavity entrance while switching the electrodes across the selected memory plane to the write pulse generator. Similarly, to read, the selected cavity is illuminated while the electrodes of the selected memory plane are switched to the amplifier input.

In both the reading and writing operation, the illumination travels down the length of the cylindrical cavity and becomes attenuated as the distance from the cavity entrance increases, thus placing a limit on the number of planes which can be used and on the storage capacity of the memory. The apparatus of the present invention substantially reduces this attenuation, and therefore allows a larger number of memory planes to be used, thus increasing the storage capacity.

Figure 5:
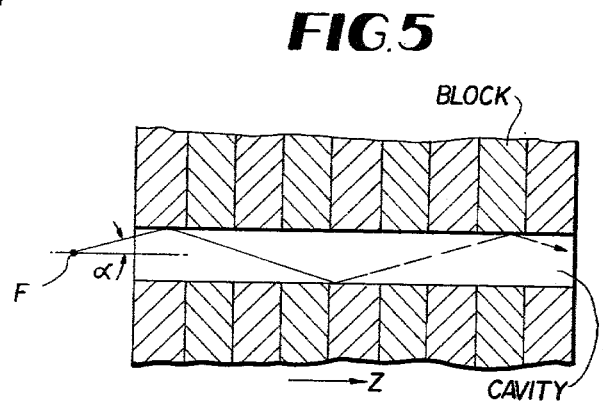

FIG. 5 is an illustration of light travelling down the interior of a cylindrical cavity, and it is seen that the light propagates by a series of multiple reflections. Generally, a parallel beam is focused at a position F, and a ray from F moves down the length of the cylinder, being absorbed during interactions with the walls, and also being reflected and scattered. A portion of the illumination intensity from the absorbed light produces the photoconductivity for the write signal or the photovoltaic output for the read signal. Typically however the light is also absorbed in other less productive processes. Since the cavity is essentially transparent, the loss of intensity as the light propagates down it in the Z direction is almost exclusively due to light absorbed within the cavity walls.

The most effective wavelength for illumination is the band gap-U.V. wavelength which is also a strongly absorbed wavelength. The intensity of illumination falls with the distance Z as given by an absorbtion constant $a_0$ and by the formula $$I = I_0 e^{-a_0 Z}$$

As can be seen form FIG. 5, $a_0$ in general depends not only on the absorbtivity of the walls but also on the number of reflections which occur. The number of reflections per unit length is dependent on the number of diameters per unit length and the absorbtion constant $a_0$ becomes dependent on the absorbtivity alone when a diameter is taken as a unit length.

Measurements which were performed have revealed that for a typical material used in the fabrication of a memory block, in terms of units of inverse diameters, $a_0 \approx 0.1$. That is, the illumination falls to 1/e (0.367) times its initial value in ten diameters and to 0.05 of its initial value in thirty diameters, and to about 0.00005 of its initial value in one hundred diameters. This fact limits the cavity length which can be used to perhaps thirty diameters, and because the number of storage cells per diameter length is also limited, the number of cells per cavity becomes limited.

In accordance with the invention, a light guide is placed in each cavity. The light guide serves not only to transmit the illumination down the cavity but also is constructed so as to allow a portion of the illumination to radiate out and illuminate the cavity walls. The attenuation in such a light guide can be controlled, so that for example, the attenuation is exponential as before but the penetration depth (1/e length) is equal to the cavity length with the cavity length set as long as is desired in order to provide an optimum number of Z planes. This is a significant improvement over the result obtained with the hollow cavity.

The light guides utilized are of the type which conduct light with minimum attenuation. The guide is comprised of a core of transparent material having an index of refraction $n_1$ and is generally coated with a cladding of transparent material having an index of refraction $n_2$, where $n_2 < n_1$. Such a guide in its normal form would conduct illumination with effectively zero attenuation over the relatively short cavity lengths involved in the optical memory block.

Figure 6:
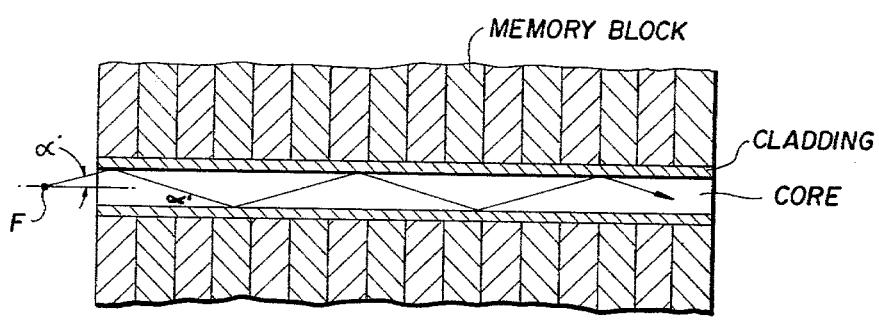
FIG. 6 is a pictorial illustration which depicts a fiber optic light guide disposed in a cylindrical cavity of a three-dimensional memory.

As illustrated in FIG. 6, in such a case no light is lost laterally; the illumination propagates with minimum loss but the cavity walls are not illuminated. Transmission of the light in such a guide is by means of successive total internal reflections, a process which results in little loss per reflection. The conditions for total internal reflection are that $n_1 > n_2$ and that the angle $\alpha'$ is less than an $\alpha$ critical.

In accordance with the improvement of the present invention, a modified optical guide is provided which allows illumination to leak out laterally along the length of the guide to illuminate the walls of the cavity. This is accomplished by frustrating the conditions for total internal reflection along the length of the guide in a controlled manner, which introduces a controlled attenuation with the illumination being lost as it propagates down the cavity.

Figure 7:
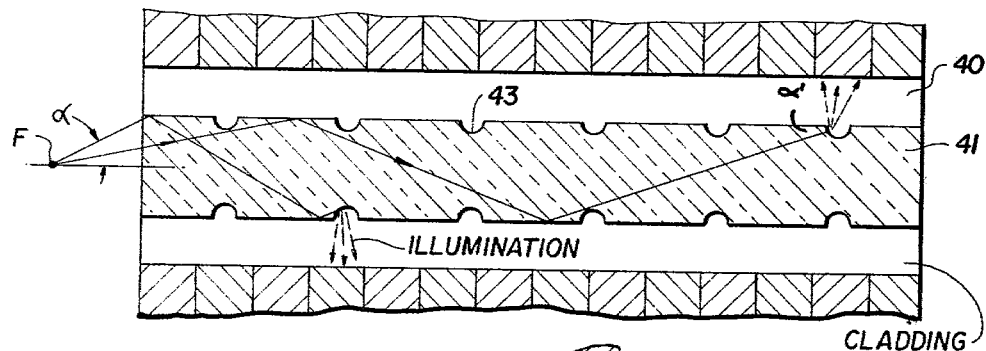
FIG. 7 is a pictorial representation of an embodiment of the present invention.
Figure 8:
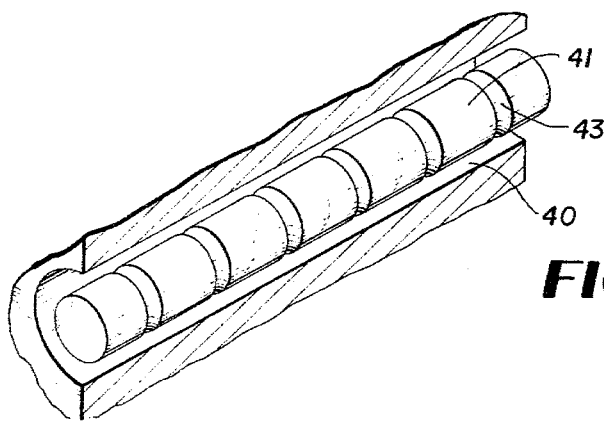
FIG. 8 is a perspective view of a fiber optic light guide means utilized in the embodiment of FIG. 7.

In an illustrative embodiment of the invention shown in FIG. 7, the controlled attenuation is effected by introducing deformations dush as pits or grooves at the core-cladding interface uniformly distributed along the length of the light guide. If necessary, such deformations may also be distributed at the cladding-wall interface. The deformations serve to change the angle $\alpha'$ so that it becomes greater than $\alpha$ critical, as when this occurs illumination leaks out to illuminate the side wall. FIG. 8 is a perspective view of the light guide utilized in FIG. 7. Referring to FIG. 7, the cladding 40 which surrounds core 41 occupies the space between the core and the cavity wall 42. Because of the high refractive index characteristic of the memory block materials (and their absorbtive nature) illumination incident at the cladding-cavity wall interface penetrates into the cavity wall. The index of refraction of the cavity wall $n_3$ is greater than $n_2$, the index of the cladding, while as discussed above $n_2$ is smaller than $n_1$, the index of the core.

In this case there is an effective attenuation constant $a_0$ and an exponential attenuation similar to that which occurs in the hollow cavity-absorbing wall situation shown in FIG. 5. However, now the attenuation constant $a_0$ can be set by controlling the spacing and configuration of the radiating pits or pit-like deformations 43. If $a_0$ is arranged to be 0.001 diameters$^{-1}$, then the 1/e level occurs at 1000 diameters down the cavity. A typical device might have 1000 layers, each 0.006" thick and be one attenuation long with a cavity diameter of 0.006". The cavity length would thus be 6".

Those familiar with the state of the light guide art will note that such a guide is well within the state of the art. It is only required to modify a light guide 0.006" in diameter with an attenuation which is negligible over a 3" length. The fact that in general, ultraviolet wavelengths rather than visible wavelengths are to be conducted presents no particular problem, since silica wave guides have been fabricated with, for example, plastic cladding which transmits ultraviolet light with low attenuation.

Also while in the embodiment shown in FIG. 7 the shape of the deformations is depicted as being approximately semi-cylindrical, it is to be understood that deformations of any shape which produce controlled leakage may be utilized, and variations will occur to those skilled in the art. The distribution of radiators or deformations need not be uniform with length but may be modified to provide an even more uniform distribution of illumination on the interior of the cavity.

It should also be appreciated that controlled leakage can be provided by controlling the value of the refractive index of the cladding along the length of the guide as well as by controlling optical contact between the surface of an unclad guide and the high refractive index block materials, and that such expedients are within the ambit of the invention.

While the invention has been described in conjunction with the specific memory disclosed in U.S. Pat. No. 4,101,975, it should be understood that the invention is applicable to any three-dimensional memory utilizing cylindrical cavities.

I wish it to be understood that I do not desire to be limited to the exact details of construction shown and described, for obvious modifications can be made by a person skilled in the art.

I claim:

1. A memory comprised of a solid three-dimensional block of material having a plurality of individual cavities disposed therein for admitting light to the interior of said block for optical writing and reading of information at selected internal positions of said block, the improvement wherein each of said cavities has an elongated cylindrical insert disposed therein and wherein each insert is comprised of a cylindrical fiber optic light guide means for facilitating transmission of light through the entire length of said cavity and having means at spaced intervals for allowing illumination to leak out laterally of said guide means to thereby illuminate the interior of the entire length of said cavity.

2. The improvement of claim 1 wherein each of said cylindrical fiber optic light guide means is comprised of a cylindrical core having a first index of refraction and a cladding surrounding the core having a second index of refraction which is smaller than said first index of refraction.

3. The improvement of claim 2 wherein said solid block of material has a third index of refraction which is greater than said first index of refraction.

4. The improvement of claim 2 wherein each of said fiber optic light guide means fills a respective cavity, the outside surface of said cladding of each guide being in contact with the wall of the cavity in which it is disposed.

5. The improvement of claim 2 wherein said means for allowing illumination to leak out laterally comprises a plurality of deformations at the core-cladding interface of said light guide means.

6. The improvement of claim 5 wherein said deformations comprise a plurality of approximately semi-cylindrical pits which are formed by removing material from said core at said core-cladding interface.

7. The improvement of claim 5 wherein said deformations are regularly spaced along the length of each said guide.

8. The improvement of claim 5 wherein said deformations are irregularly spaced along the length of each said guide.

9. The improvement of claim 2 or 5 wherein said solid block of material is comprised of a plurality of juxtaposed memory planes, each plane being comprised of a photovoltaic-ferroelectric layer and a photoconductive layer sandwiched between two electrodes, said cylindrical cavities penetrating through all of said layers.

* * * * *